United States Patent
Sato (10) Patent No.: US 7,679,508 B2
(45) Date of Patent: Mar. 16, 2010

(54) SENSING DEVICE FOR DETECTING APPROACHING OBJECT

(75) Inventor: Hiroaki Sato, Gunma-Ken (JP)

(73) Assignee: Victor Company of Japan, Limited, Yokohama (JP)

( * ) Notice: Subject to any disclaimer, the term of this patent is extended or adjusted under 35 U.S.C. 154(b) by 380 days.

(21) Appl. No.: 11/669,352

(22) Filed: Jan. 31, 2007

(65) Prior Publication Data

US 2007/0273510 A1    Nov. 29, 2007

(30) Foreign Application Priority Data

Feb. 3, 2006  (JP)  ............................. 2006-027399
Nov. 28, 2006  (JP)  ............................. 2006-320293

(51) Int. Cl.
*G08B 21/00* (2006.01)
(52) U.S. Cl. .................. 340/540; 340/541; 340/552; 340/565; 340/573.1; 342/27; 342/28
(58) Field of Classification Search ............... 340/540, 340/552, 541, 565, 573.1; 342/27, 28
See application file for complete search history.

(56) References Cited

U.S. PATENT DOCUMENTS 3,943,503 A * 3/1976 Whitman .................... 340/552
4,605,922 A * 8/1986 Blattman et al. ............ 340/552
2005/0184876 A1 * 8/2005 Tokudome ............... 340/573.1

FOREIGN PATENT DOCUMENTS

JP    2001-203565    7/2001

* cited by examiner

*Primary Examiner*—Toan N Pham
*Assistant Examiner*—Kerri McNally
(74) *Attorney, Agent, or Firm*—Connolly Bove Lodge & Hutz LLP (57) ABSTRACT

A sensing device for detecting an approaching object is composed of a sensor section that includes a detection electrode supplied with a detection source signal having a prescribed frequency and another detection electrode disposed in close vicinity to the detection electrode, a communication signal amplifier that amplifies the communication signal and outputs the amplified communication signal as an amplifier output signal, an integrator that integrates the amplifier output signal and outputs a judging signal for judging whether or not an object approaches the sensor section, and a detection sub-signal switch that is disposed between an output side of the communication signal amplifier and an input side of the integrator. A communication signal is obtained from the detection source signal that is transmitted to the other detection electrode from the detection electrode and attenuated thereat when an object approaches the sensor section. The detection sub-signal switch periodically switches on only during a prescribed period in which a peak value of the amplifier output signal is included in response to a detection sub-signal, wherein a frequency of the detection sub-signal is equal to that of the detection source signal, and the detection sub-signal maintains specific phase relation with the detection source signal, and further a duty ratio of the detection sub-signal is less than 50%.

4 Claims, 11 Drawing Sheets

SENSING DEVICE FOR DETECTING APPROACHING OBJECT

BACKGROUND OF THE INVENTION

1. Field of the Invention

The present invention relates to a sensing device for detecting an approaching object such as a human body, which is useful for any of a switching circuit for electronic equipment, an additional function for display equipment and a touch sensor for electronic equipment, and further the approach sensing device is excellent in resistant to noise.

2. Description of the Related Art

A sensing device for detecting an approaching object (hereinafter referred to as approach sensing device) is a device that detects an approaching object such as a human body and notifies electronic equipment of the approaching object. With respect to a detection method of such an approach sensing device, various detection methods such as detecting infrared radiation emitted from a human body and applying the Doppler effect of a microwave have been available for such an approach sensing device.

One of approach sensing devices adopting such detection methods, there exists an approach sensing device of an electrostatic capacitance type, which uses change of capacitance of a capacitor constituted by a pair of detection electrodes in response to an approaching object such as a human body to the pair of detection electrodes. Such an approach sensing device of the electrostatic capacitance type can detect an object approaching a relatively narrow area, so that a plurality of sensing devices can be disposed on an insulation panel of electronic equipment. In this connection, such an approach sensing device of the electrostatic capacitance type is widely used in electronic equipment as an inputting device that alternates a mechanical switch of the electronic equipment. Because a switch contact of a mechanical switch is gradually worn out in accordance with repeated turning on and off operations. However, wearing of switch contact never occurs in an approach sensing device of the electrostatic capacitance type.

Further, various kinds of circuitry are available for an approach sensing device of the electrostatic capacitance type. As one example of such circuitry, there exists one circuitry that makes use of a communication signal, wherein the communication signal changes in response to an approaching object such as a human body. In the circuitry, a detection source signal having a prescribed frequency is supplied to one of a pair of detection electrodes, and the detection source signal is transmitted to another detection electrode of the pair of detection electrodes. Then the transmitted detection source signal is changed in response to an approaching object and outputted as a communication signal.

The Japanese publication of unexamined patent applications No. 2001-203565 disclosed an approach sensor that detected an approaching object such as a human body.

Figure 12:
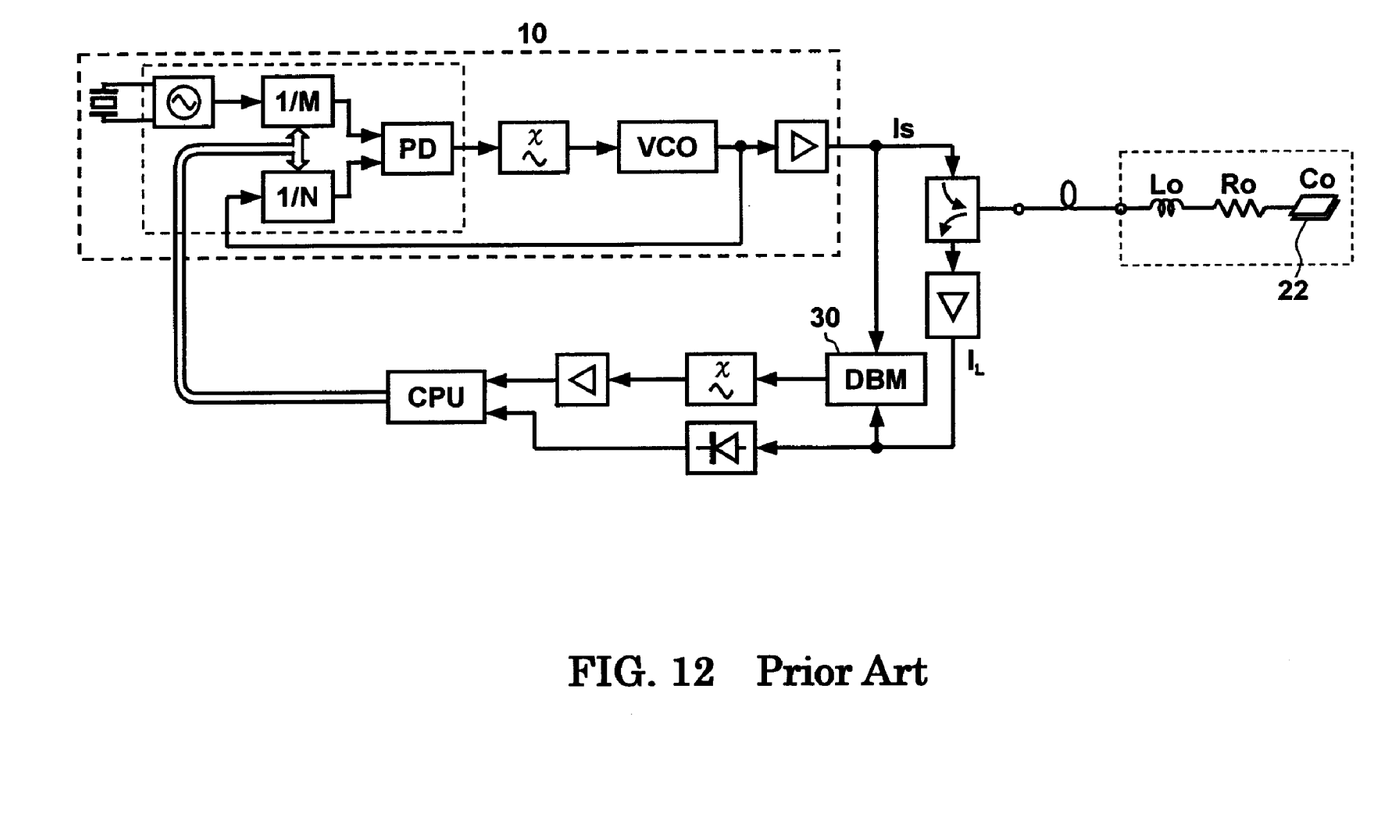
FIG. 12 is a schematic diagram of a conventional sensing device for detecting an approaching object according to the prior art.

FIG. 12 is a schematic diagram of a conventional sensing device for detecting an approaching object (hereinafter referred to as approach sensing device) according to the Japanese publication of unexamined patent applications No. 2001-203565.

According to the Japanese publication of unexamined patent applications No. 2001-203565, as shown in FIG. 12, a phase of a measuring signal "Is", which is outputted from an oscillation circuit 10, is shifted in response to an object such as a human body approaching to a detecting plate 22, that is, an approach sensor of the electrostatic capacitance type. Then the measuring signal "Is" is outputted as an output signal "$I_L$".

Phase difference between the output signal "$I_L$" and the measuring signal "Is" is compared by a DBM (double balanced modulator) or a phase detector 30.

Accordingly, approach of an object such as a human body can be detected.

However, in the above-mentioned approach sensing device of the electrostatic capacitance type, which makes use of the output signal "$I_L$" (communication signal) that is obtained from the measuring signal "Is" (detection source signal) that is supplied to one of a pair of detecting electrodes and changes in response to an approaching object such as a human body, if an AC electric noise generated in electric equipment such as a TV display or a radio wave emitted from an aeronautical radio station or a maritime radio station exists in the surrounding of the approach sensing device, then such an AC electric noise or a radio wave is possibly transmitted to the detection electrodes through a human body as an interfering signal.

Accordingly, the approach sensing device may not be able to detect change of the communication signal although a human body approaches, and results in miss-operation.

Although the Japanese publication of unexamined patent applications No. 2001-203565 fails to teach countermeasure for such an interfering signal, it is commonly known that a band pass filter is provided in a transmission line for a communication signal so as to eliminate an interfering signal from a communication signal.

In this connection, relatively simple circuitry can eliminate an interfering signal in case a frequency of the interfering signal is sufficiently away from that of a detection source signal. However, in case a frequency of the interfering signal is close to that of the detection source signal, a band pass filter having narrow bandwidth in complex circuitry is essential for eliminating such an interfering signal having a frequency close to that of the detection source signal.

Accordingly, there exist problems such that a frequency of a detection source signal and a pass band of a band pass filter are hardly controlled or adjusted, and that designing the circuitry results in difficult.

Further, a number of component parts constituting a band pass filter in narrow bandwidth increases. Particularly, in case a plurality of approach sensing devices is disposed in a limited area, it creates another problem that a scale of circuit increases and cost of component parts rises, and further space for component parts on a circuit board is strained.

SUMMARY OF THE INVENTION

Accordingly, in consideration of the above-mentioned problems of the prior arts, an object of the present invention is to provide a sensing device for detecting an approaching object of the electrostatic capacitance type, which uses a communication signal obtained from a detection source signal that is supplied to one of a pair of detection electrodes and changes in response to an approaching object such as a human body. The sensing device is never affected by an interfering signal having a frequency close to that of the detection source signal without using a band pass filter having narrow bandwidth, and excellent in resistant to electric noise.

In order to achieve the above object, the present invention provides, according to an aspect thereof, a sensing device for detecting an approaching object comprising: (a) a sensor section, the sensor section including (1) a detection electrode supplied with a detection source signal having a prescribed frequency, and (2) another detection electrode disposed in close vicinity to the detection electrode, wherein a communication signal is obtained from the detection source signal that is Transmitted to the other detection electrode from the detection electrode and attenuated thereat when an object approaches the sensor section; (b) a communication signal amplifier amplifying the communication signal and outputting the amplified communication signal as an amplifier output signal; (c) an integrator integrating the amplifier output signal and outputting a judging signal for judging whether or not an object approaches the sensor section; and (d) a detection sub-signal switch disposed between an output side of the communication signal amplifier and an input side of the integrator; wherein the detection sub-signal switch periodically switches on only during a prescribed period in which a peak value of the amplifier output signal is included in response to a detection sub-signal, wherein a frequency of the detection sub-signal is equal to that of the detection source signal, and wherein the detection sub-signal maintains specific phase relation with the detection source signal, further wherein a duty ratio of the detection sub-signal is less than 50%.

Other object and further features of the present invention will be apparent from the following detailed description when read in conjunction with the accompanying drawings.

DETAILED DESCRIPTION OF THE PREFERRED EMBODIMENTS

First Embodiment

With referring to FIGS. 1-7, a sensing device for detecting an approaching object (hereinafter referred to as approach sensing device) according to a first embodiment of the present invention is described.

Figure 1:
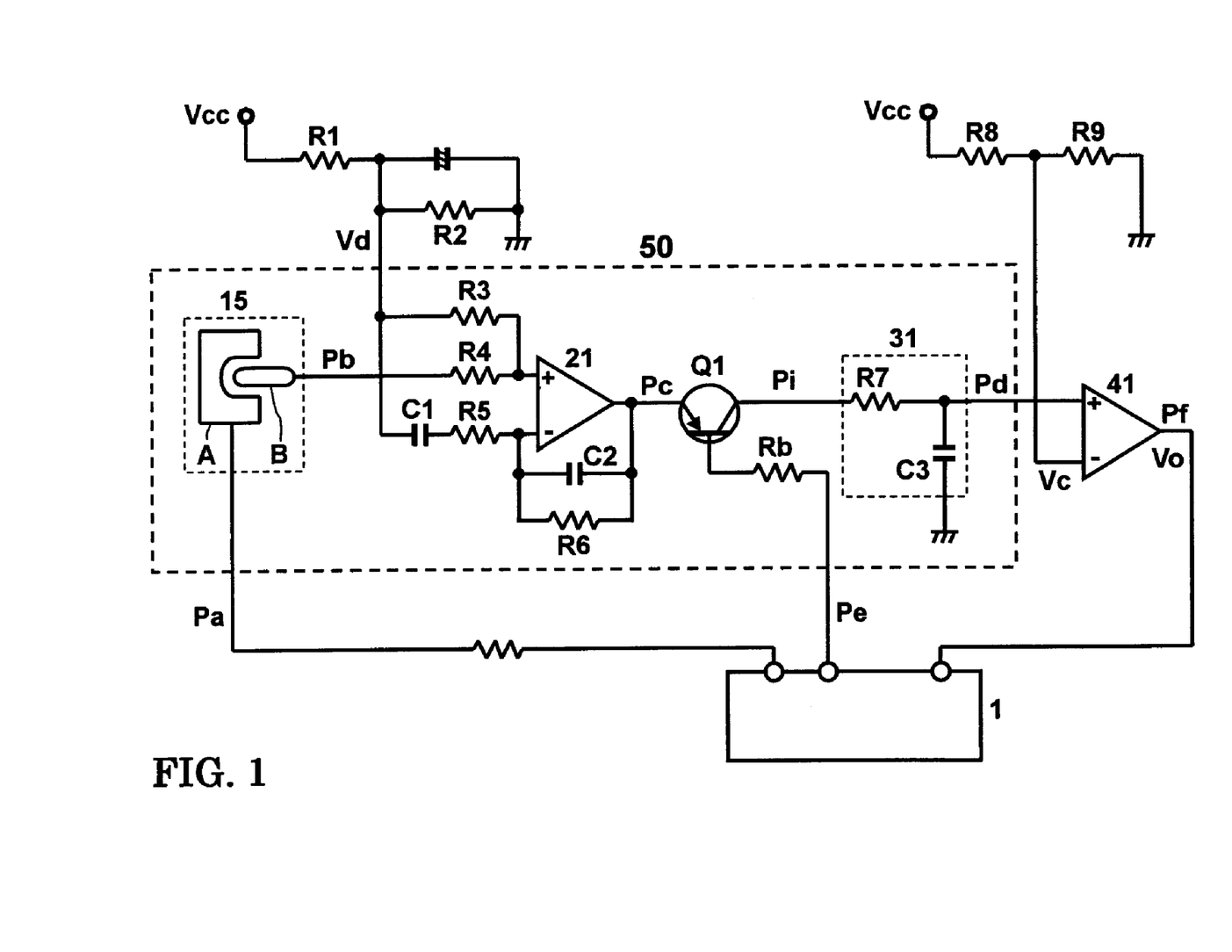
FIG. 1 is a schematic diagram of a sensing device for detecting an approaching object according to a first embodiment of the present invention.

FIG. 1 is a schematic diagram of an approach sensing device according to a first embodiment of the present invention.

FIGS. 2(a)-2(f) are timing charts exhibiting operations of the approach sensing device shown in FIG. 1.

Figure 3:
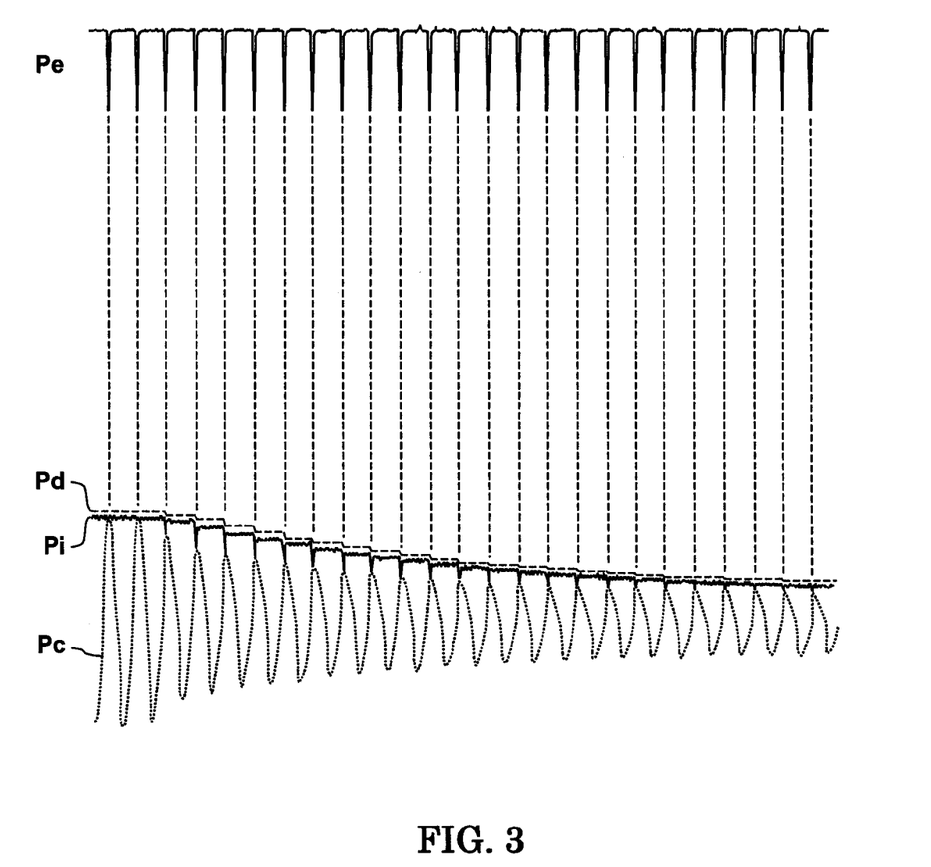
FIG. 3 shows waveforms of signals at each stage of the sensing device shown in FIG. 1 exhibiting a transient state when an object is approaching a sensor section of the sensing device.

FIG. 3 shows waveforms of signals at each stage of the approach sensing device shown in FIG. 1 exhibiting a transient state when an object is approaching a sensor section of the approach sensing device.

Figure 4:
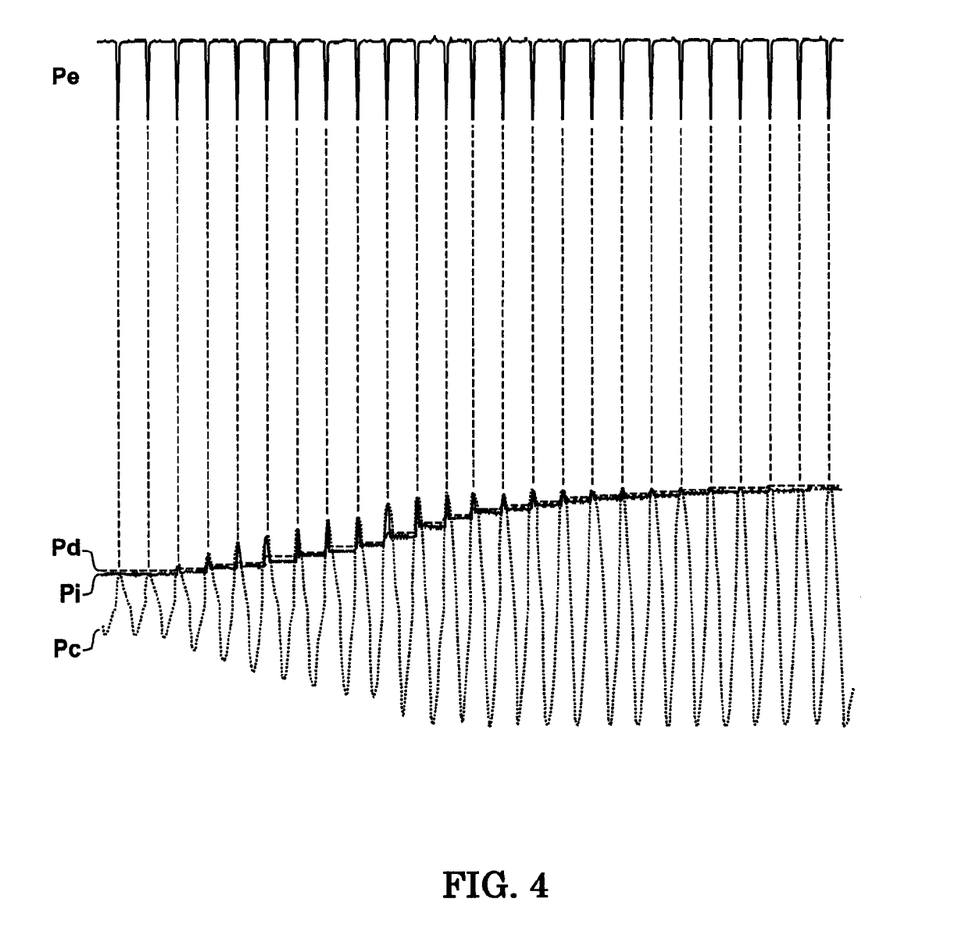
FIG. 4 shows waveforms of signals at each stage of the sensing device shown in FIG. 1 exhibiting a transient state when an object is leaving from the sensor section of the sensing device.

FIG. 4 shows waveforms of signals at each stage of the approach sensing device shown in FIG. 1 exhibiting a transient state when an object is leaving from the sensor section of the approach sensing device.

Figure 5:
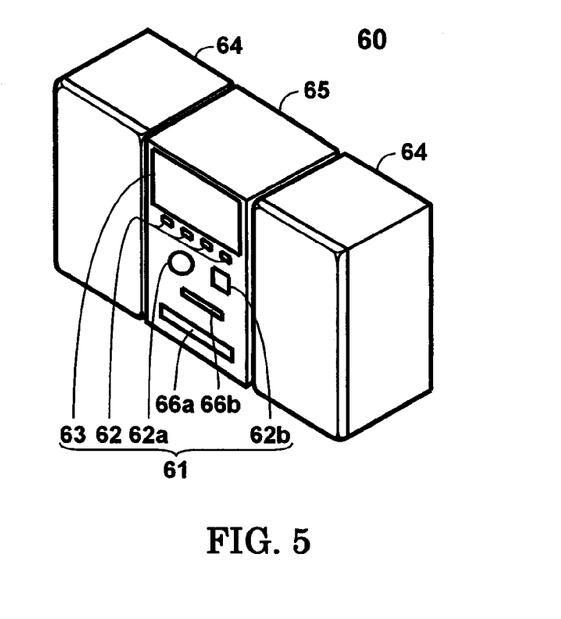
FIG. 5 is a perspective view of a component audio system adopting the sensing device according to the present invention.

FIG. 5 is a perspective view of a component audio system adopting the approach sensing device according to the present invention.

Figure 6:
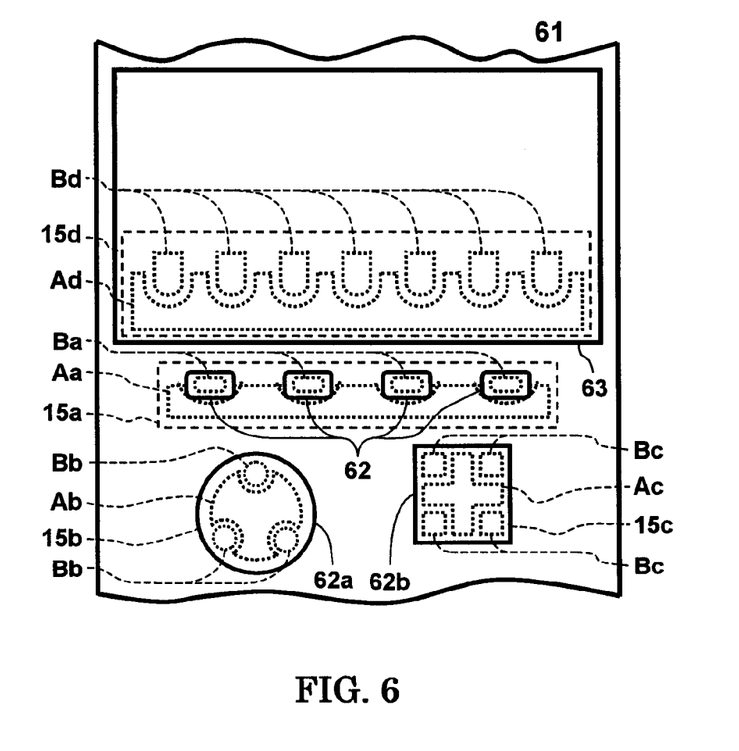
FIG. 6 is an enlarged plan view of an operation panel of the component audio system shown in FIG. 5.

FIG. 6 is an enlarged plan view of an operation panel of the component audio system shown in FIG. 5.

Figure 7:
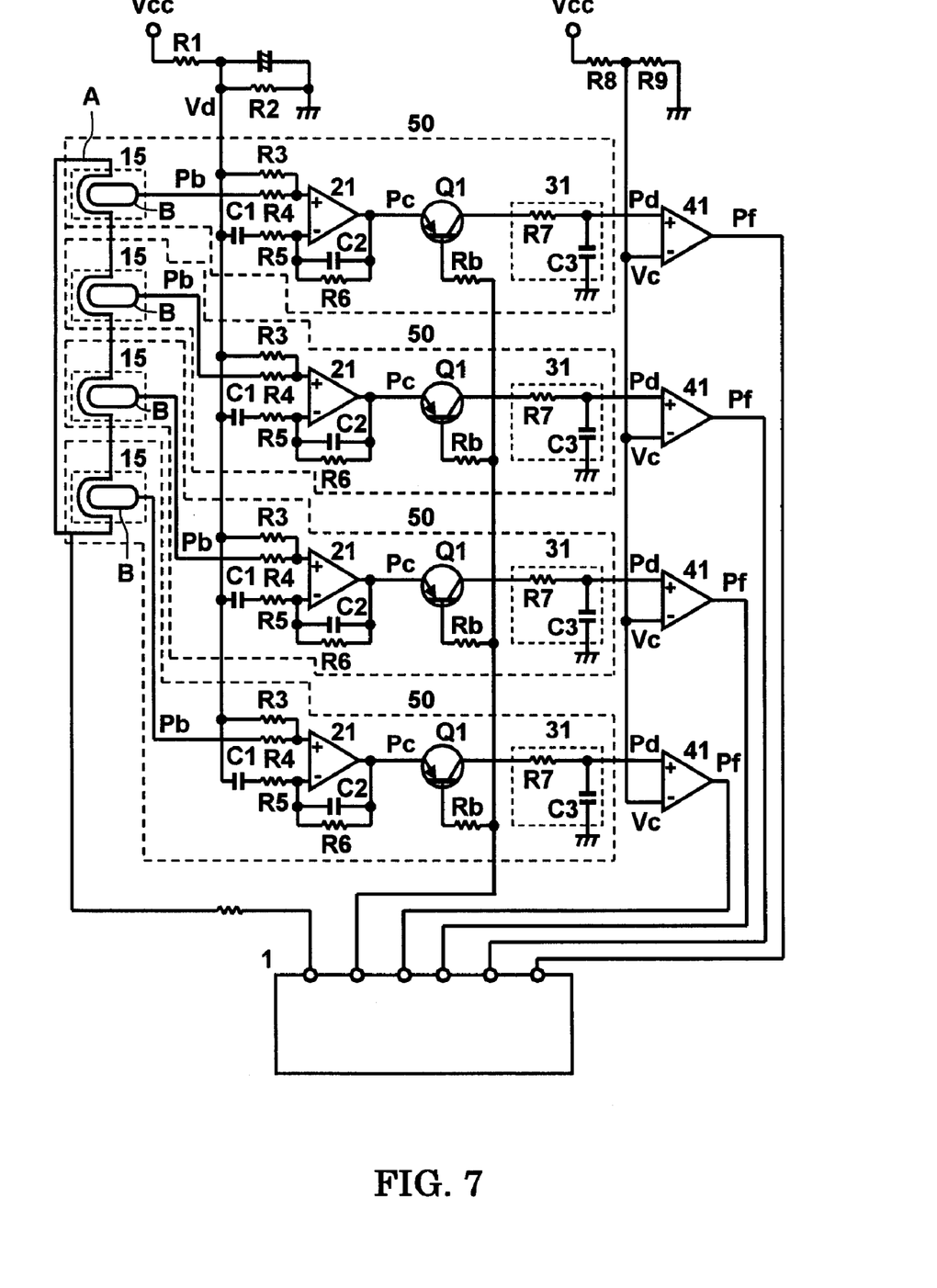
FIG. 7 is a schematic diagram of an application of the sensing device shown in FIG. 1, wherein a plurality of the sensing devices is connected in parallel.

FIG. 7 is a schematic diagram of an application of the approach sensing device shown in FIG. 1, wherein a plurality of the approach sensing devices is connected in parallel.

In FIG. 1, an approach sensing device 50 is composed of a sensor section 15, a communication signal amplifier (hereinafter referred to as amplifier) 21, a detection sub-signal switch Q1 or a switching transistor Q1 of the PNP-type (hereinafter generically referred to as switching transistor Q1) and an integrator 31.

The sensor section 15 is constituted by an detection electrode "A" that is supplied with a detection source signal Pa having a prescribed frequency such as a rectangular wave of 25 kHz, for instance, will be detailed and another detection electrode "B" that is disposed in close vicinity to the detection electrode "A". The detection source signal Pa is transmitted to the other detection electrode "B" and outputted from the sensor section 15 as a communication signal Pb. In this connection, the communication signal Pb is attenuated in response to an object to be detected like a human body such as a finger approaching the sensor section 15, wherein the object makes electrostatic capacitance of a capacitor constituted by the pairwise detection electrodes "A" and "B" change.

The amplifier 21 amplifies the communication signal Pb and outputs the amplified communication signal Pb as an amplifier output signal Pc.

The switching transistor Q1 conducts a switching operation and outputs the communication signal Pc as a collector output signal Pi.

The integrator 31 integrates the collector output signal Pi, and then outputs a judging signal Pd for judging whether or not an object approaches the sensor section 15.

Further, the switching transistor Q1 functions as the above-mentioned detection sub-signal switch that conducts a switching operation periodically in accordance with a detection sub-signal Pe, which is supplied from a microcomputer 1 for controlling through a base resistor Rb. Hereupon, a frequency of the detection sub-signal Pe is equal to that of the detection source signal Pa, and the detection sub-signal Pe maintains specific phase relation with the detection source signal Pa, and further a duty ratio of the detection sub-signal Pe is less than 50%.

Figure 2A:
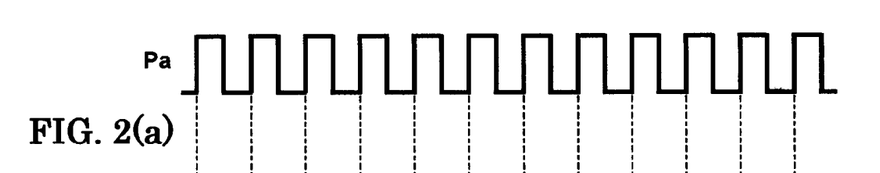
FIGS. 2(a)-2(f) are timing charts among signals at each stage of the sensing device shown in FIG. 1 exhibiting operations of the approach sensing device.
Figure 2B:
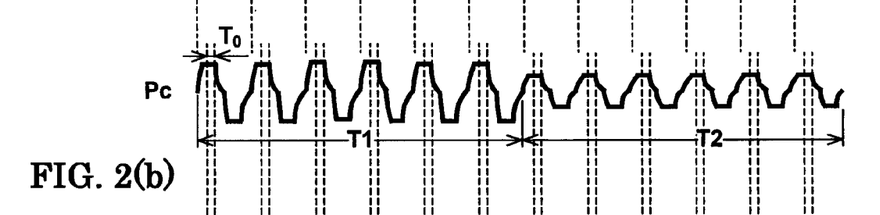
Figure 2C:
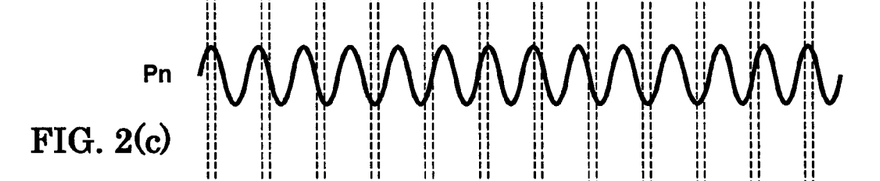
Figure 2D:
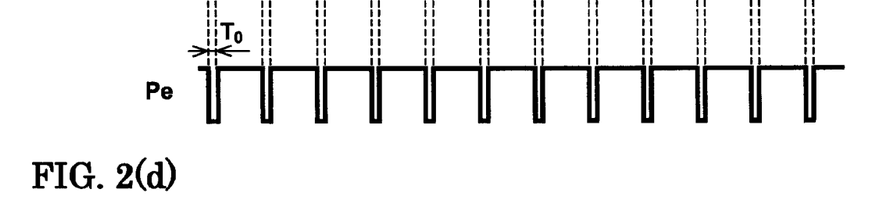

Furthermore, the switching transistor Q1 periodically turns on only during a prescribed period $T_0$, wherein the prescribed period $T_0$ is defined by the detection sub-signal Pe as shown in FIG. 2(d). In this connection, as shown in FIG. 2(b), a peak value of the communication signal Pc is included in the prescribed period $T_0$. Then, the collector output signal Pi from the collector of the switching transistor Q1 is integrated by the integrator 31, and results in the judging signal Pd.

As mentioned above, the sensor section 15 according to the first embodiment of the present invention is constituted by the detection electrode "A" and the other detection electrode "B" that is disposed in close vicinity to the detection electrode "A". The detection electrode "A" is paired with the other detection electrode "B" and forms a capacitor having electrostatic capacitance.

Further, the detection electrode "A" is supplied with a rectangular wave of 25 kHz as the detection source signal Pa. The detection source signal Pa is transmitted to the other detection electrode "B" and results in generating the communication signal Pb.

The other detection electrode "B" is connected to a non-inverting input terminal "+" of the amplifier 21 through a protective resistor R4 for protecting an input circuit.

Further, the non-inverting input terminal "+" of the amplifier 21 is supplied with a bias voltage Vd through a bias resistor R3, wherein the bias voltage Vd is assigned by dividing a supply voltage Vcc by means of bleeder resistors R1 and R2.

Furthermore, the bias voltage Vd is also supplied to an inverting input terminal "−" of the amplifier 21 through a resistor R5.

More, a resistor R6 is connected across the inverting input terminal "−" and an output terminal of the amplifier 21, wherein the resistors R5 and R6 function as feedback resistors, which determine amplification degree of the amplifier 21.

Moreover, capacitors C1 and C2, which function as a wide-band band pass filter, are connected to the inverting input terminal "−" in series with the feedback resistor R5 and across the inverting input terminal "−" and the output terminal in parallel with the feedback resistor R6 respectively.

By this configuration, the amplifier 21 amplifies the communication signal Pb in proportion to the amplification degree that is determined by the feedback resistors R5 and R6 and outputs the amplified communication signal Pb as the amplifier output signal Pc.

In addition thereto, in case the communication signal Pb contains an interfering signal of which frequency is sufficiently away from the frequency of the detection source signal Pa, the capacitors C1 and C2 function as a band pass filter and result in eliminating the interfering signal.

The output terminal of the amplifier 21 is connected to the emitter terminal of the switching transistor Q1. The collector terminal of the switching transistor Q1 is connected to the integrator 31 that is constituted by a resistor R7 and a capacitor C3 of which one terminal is grounded.

As mentioned above, the detection sub-signal Pe, which is generated in the microcomputer 1, is inputted into the base terminal of the switching transistor Q1 through the base resistor Rb.

Accordingly, the switching transistor Q1 is periodically switched on and off in response to the detection sub-signal Pe, and then the collector output signal Pi is outputted from the switching transistor Q1. The collector output signal Pi is inputted into the integrator 31 only when the switching transistor Q1 is switched on, that is, only during the prescribed period $T_0$. In this connection, as shown in FIG. 2(b), a peak value of the communication signal Pc is included in the prescribed period $T_0$; further details will be described.

Further, it is desirable for the detection sub-signal Pe to have a phase and a duty ratio that make the switching transistor Q1 switch on during the prescribed period $T_0$, wherein a peak value of the communication signal Pc is included in the prescribed period $T_0$ as shown in FIG. 2(b). By the above-mentioned phase and duty ratio, a signal to noise ratio (S/N) of the approach sensing device 50 is improved, and resistant to electric noise against an interfering signal having a frequency close to the frequency of the detection source signal Pa is improved furthermore, it will be detailed.

Furthermore, in the first embodiment of the present invention, a duty ratio of the detection sub-signal Pe is defined to be 10%, and as shown in the timing charts of FIGS. 2(b) and 2(d) to be detailed, a phase of the detection sub-signal Pe is defined to be synchronized with the amplifier output signal Pc at the peak of the amplifier output signal Pc. Consequently, the switching transistor Q1 functions as though the switching transistor Q1 cuts out only a peak value of the amplifier output signal Pc and makes the integrator 31 integrate each peak value of the amplifier output signal Pc.

The integrator 31 outputs an integrated value of the collector output signal Pi or the amplifier output signal Pc as the judging signal Pd. Hereupon, as mentioned above, the integrated value of the amplifier output signal Pc is obtained by integrating each peak value of the amplifier output signal Pc during a specific period, that is, the prescribed period $T_0$ wherein a peak value of the communication signal Pc is included in the prescribed period $T_0$ as shown in FIG. 2(b). Then the judging signal Pd is inputted into a non-inverting input terminal "+" of a comparator 41.

Further, another input terminal, that is, an inverting input terminal "−" of the comparator 41 is supplied with a comparative voltage Vc, which is defined by dividing the supply voltage Vcc by means of resistors R8 and R9.

Figure 2E:
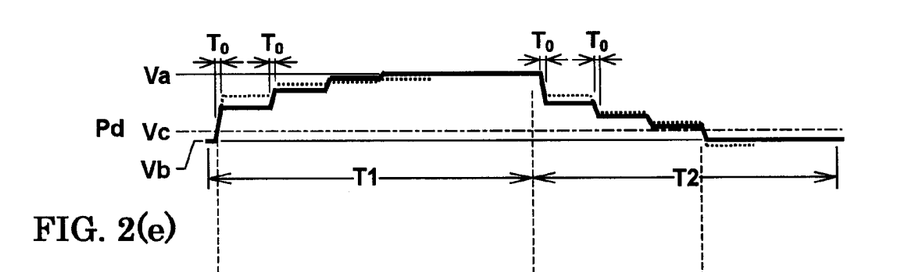

A value of the judging signal Pd changes in response to a state whether or not an object such as a human body approaches the sensor section 15. In this connection, by adjusting resistance values of the resistors R8 and R9, a value of the comparative voltage Vc can be assigned so as to be an appropriate value between a voltage value Va, which is a maximum voltage value of the judging signal Pd when an object does not approach, and another voltage value Vb, which is a minimum voltage value of the judging signal Pd when an object approaches. In other words, the appropriate value of the comparative voltage Vc is defined such that "Va>Vc>Vb". The relation among the voltage values Va, Vb and Vc is illustrated in FIG. 2(e).

Accordingly, a judging voltage Vo is outputted from an output terminal of the comparator 41 as a comparator output signal Pf in response to a state whether or not an object such as a human body approaches the sensor section 15.

The output terminal of the comparator 41 is connected to the microcomputer 1, and then the microcomputer 1 conducts prescribed operations in response to the judging voltage Vo of the comparator output signal Pf.

In reference to the timing charts shown in FIGS. 2(a)-2(f), descriptions are given to operations of the approach sensing device 50 when an object to be detected such as a human body approaches the sensor section 15 of the approach sensing device 50 next.

As shown in FIG. 2(a), the detection source signal Pa is a rectangular wave having a prescribed frequency such as 25 kHz, for instance, and supplied to the detection electrode "A" from the microcomputer 1. A waveform of the detection source signal Pa is always constant regardless of whether or not an object like a human body such as a finger approaches the sensor section 15 of the approach sensing device 50.

The amplifier output signal Pc is an amplified communication signal Pb that is amplified by the amplifier 21, wherein the communication signal Pb is obtained from the detection source signal Pa that is transmitted to the other detection electrode "B" from the detection electrode "A". As shown in FIG. 2(b), amplitude of the amplifier output signal Pc changes in response to a state whether or not an object such as a human body approaches the sensor section 15 of the approach sensing device 50. The amplitude is maximal during a period T1 when no object approaches the sensor section 15. However, the amplitude decreases during a period T2 when an object approaches the sensor section 15.

In this regard, the waveform of the amplifier output signal Pc slightly varies from that of the detection source signal Pa due to affection of the detection electrodes "A" and "B" forming a capacitor and the capacitors C1 and C2, wherein these capacitors function as a wide-band band pass filter, although a frequency of the amplifier output signal Pc is the same as that of the detection source signal Pa. Consequently, a phase of the amplifier output signal Pc results in shifting from that of the detection source signal Pa.

In addition thereto, a waveform of the communication signal Pb is not illustrated in any drawings.

The detection sub-signal Pe is a rectangular wave, which is generated in the microcomputer 1. Hereupon, a phase and a duty ratio of the detection sub-signal Pe is defined so as to coincide with a peak value of the amplifier output signal Pc.

Further, as shown in FIG. 2(d), a waveform of the detection sub-signal Pe is always constant regardless of whether or not an object like a human body such as a finger approaches the sensor section 15 of the approach sensing device 50 as the same manner as the detection source signal Pa.

The judging signal Pd is an analog signal that is obtained by integrating each peak value of the amplifier output signal Pc during a specific period, that is, during the prescribed period $T_0$, wherein a peak value of the communication signal Pc is included in the prescribed period $T_0$ as shown in FIG. 2(b). In this connection, the judging signal Pd does not change when the switching transistor Q1 is in the off state. Consequently, as shown in FIG. 2(e), an output waveform of the judging signal Pd is not continuous, but changes in stages.

Figure 2F:
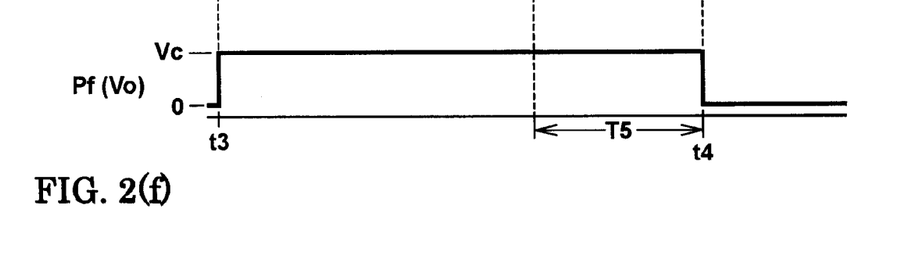

As shown in FIG. 2(f), the comparator output signal Pf is a digital signal that is obtained by comparing a voltage of the judging signal Pd with the comparative voltage Vc and outputted as the judging voltage Vo, wherein the voltage of the judging signal Pd is smaller than the maximum voltage value Va and larger than the minimum voltage value Vb as shown in FIG. 2(e).

As shown in FIG. 2(b), during the period T1 in which an object like a human body such as a finger does not approach the sensor section 15, electrostatic capacitance of the capacitor constituted by the pairwise detection electrodes "A" and "B" is sufficiently large enough, so that a peak voltage of the amplifier output signal Pc exhibits the higher voltage.

On the contrary, during the period T2 in which an object like a human body such as a finger approaches the sensing section 15, the object functions as a by-pass capacitor for grounding that is connected in parallel with the pairwise detection electrodes "A" and "B" constituting the sensor section 15, and resulting in decreasing electrostatic capacitance of the capacitor constituted by the pairwise detection electrodes "A" and "B". As a result, a peak voltage of the amplifier output signal Pc decreases as shown in FIG. 2(b).

During the period T1 in which an object such as a human body does not approach the sensor section 15, a voltage of the judging signal Pd increases in stages and finally reaches its equilibration state at the maximum voltage value Va as shown in FIG. 2(e), because a peak voltage of the amplifier output signal Pc is higher enough. Hereupon, the judging signal Pd, which is obtained by integrating each peak value of the amplifier output signal Pc in a specific period, that is, in the prescribed period $T_0$, in which the peak value of the amplifier output signal Pc is included, wherein the prescribe period $T_0$ is defined by the detection sub-signal Pe.

On the other hand, during the period T2 in which an object such as a human body approaches the sensing section 15, a voltage of the judging signal Pd decreases in stages and finally reaches its equilibration state at the minimum voltage value Vb as shown in FIG. 2(e), because a peak voltage of the amplifier output signal Pc is rather lower.

As shown in FIG. 2(e), the comparative voltage Vc is defined so as to be a value between the maximum voltage value Va and the minimum voltage value Vb. Consequently, as shown in FIGS. 2(e) and 2(f), the comparator output Pf turns on at a moment t3 when a voltage value of the judging signal Pd exceeds the comparative voltage Vc, and the comparator 41 outputs the comparator output signal Pf having the comparative voltage Vc as the judging voltage Vo to the microcomputer 1.

On the other hand, in case the judging signal Pd decreases when an object approaches the sensor section 15, as shown in FIGS. 2(e) and 2(f), the comparator 41 ceases to output the judging voltage Vo to the microcomputer 1 at a moment t4 when the judging signal Pd falls to the minimum voltage value Vb below the comparative voltage Vc.

As mentioned above, the approach sensing device 50 functions so as to turn the comparator output signal Pf on or off in response to a state whether or not an object such as a human body approaches the sensing section 15.

Accordingly, by inputting the comparator output signal Pf into the microcomputer 1, a control section of the microcomputer 1 conducts predetermined operations in response to a state whether or not the comparator output signal Pf exists.

In FIGS. 2(e) and 2(f), time duration T5 from a moment when an object approaches the sensor section 15 to the moment t4 when the judging voltage Vo is ceased to output is decided by a time constant of the integrator 31.

Accordingly, the time duration T5 can be defined by adjusting resistance and capacitance values of the resistor R7 and the capacitor C3 constituting the integrator 31 so as to be appropriate time duration.

Succeedingly, descriptions are given to a specific case such that an interfering signal such as an AC electric noise and a radio wave exists in the surrounding of the approach sensing device 50.

In case a frequency of an interfering signal is sufficiently away from the frequency of the detection source signal Pa, the above-mentioned wide-band band pass filter that is constituted by the capacitors C1 and C2 can eliminate such an interfering signal.

Even though an interfering signal having a frequency close to the frequency of the detection source signal Pa exists in the surrounding of the approach sensing device 50, the amplifier output signal Pc is inputted into the integrator 31 only during a specific period, that is, only during the prescribed period $T_0$, which is defined by the detection sub-signal Pe of which frequency is the same as that of the detection source signal Pa, wherein the peak value of the amplifier output signal Pc is included in the prescribed period $T_0$. As shown in FIGS. 2(b) and 2(c), an interfering signal Pn of which frequency is slightly different from that of the detection source signal Pa is not in synchronism with the amplifier output signal Pc.

More specifically, as shown in FIGS. 2(b) and 2(c), each peak of the interfering signal Pn having a frequency slightly different from the frequency of the detection source signal Pa does not always coincide with each peak of the amplifier output signal Pc having the same frequency as the detection source signal Pa in the each prescribed period $T_0$. Even though an output of the judging signal Pd exhibits a higher value than a regular value that is obtained essentially from the amplifier output signal Pc due to the interfering signal Pn during the one prescribed period $T_0$, the interfering signal Pn having a lower value than a regular value that is obtained essentially from the amplifier output signal Pc will be contained in the judging signal Pd during some prescribed period $T_0$ as long as the amplifier output signal Pc and the interfering signal Pn are integrated totally and conducted as the judging signal Pd. As a result, affection of the interfering signal Pn shown by a doted line in FIG. 2(e) is cancelled out in accordance with progress of integration and not involved in the judging signal Pd finally.

Accordingly, the approach sensing device 50 never conducts miss-operation even though an interfering signal having a frequency close to the frequency of the detection source signal Pa exists in the surrounding of the approach sensing device 50.

FIGS. 3 and 4 exhibit waveforms of respective signals based on waveforms that are actually observed by an oscilloscope so as to compliment the timing charts shown in FIGS. 2(a)-2(f).

In FIGS. 3 and 4, a waveform Pe is a waveform of a detection sub-signal equivalent to that shown in FIG. 2(d), a waveform Pi is a waveform of a collector output signal of the collector terminal of the switching transistor Q1, a waveform Pd is an output waveform of the integrator 31 equivalent to that shown in FIG. 2(e), and a waveform Pc is a waveform of an amplifier output signal equivalent to that shown in FIG. 2(b).

Further, FIG. 3 shows waveforms of the signals Pc, Pi and Pd in a transient state of an object to be detected such as a human body that is approaching the sensor section 15 when no object existed in the surrounding of the sensor section 15.

Furthermore, FIG. 4 shows waveforms of the signals Pc, Pi and Pd in a transient state of the object that is leaving from the sensor section 15 when the object has approached the sensor section 15.

More, in order to explain voltage change in a transient state of each stage of the circuit of the approach sensing device 50 shown in FIG. 1 according to the first embodiment of the present invention, FIGS. 3 and 4 show simulated waveforms based on an observation under a condition such that the time constant of the integrator 31 is drastically reduced from an optimized time constant to be practical.

In the schematic diagram of the approach sensing device 50 shown in FIG. 1 according to the first embodiment of the present invention, the capacitor C3 constituting the integrator 31 is charged through the emitter and collector terminals of the switching transistor Q1.

On the contrary, discharging the capacitor C3 is also conducted through the emitter and collector terminals of the switching transistor Q1.

In this regard, the emitter and the collector of a regular transistor are formed in a symmetrical configuration with respect to the base. Consequently, the switching transistor Q1 properly operates as a switch even though voltages supplied to the emitter and collector terminals are inverted.

As mentioned above, according to the above-mentioned circuit of the approach sensing device 50, the approach sensing device 50 is never affected by an interfering signal having a frequency close to the frequency of the detection source signal Pa even though a narrow-band band pass filter is not adopted. In this connection, it is easy to design circuitry and also it is not necessary to control or adjust a frequency of a detection source signal Pa or a pass frequency band of a band pass filter.

Accordingly, it is possible to realize the approach sensing device 50 that is reduced in circuit scale, excellent in cost saving and in space saving, and further high in operational stability.

One example of actual application of the approach sensing device 50 is exemplified by an operation panel 61 of a component audio system 60 shown in FIG. 5.

In FIG. 5, the component audio system 60 is composed of a main unit 65 and a plurality of speaker systems 64, hereupon one pair of speaker systems 64 is illustrated in FIG. 5. A front surface of the main unit 65 is furnished with the operation panel 61 and a plurality of slots 66a and 66b for inserting various kings of recording mediums such as an optical disc and a magneto-optical disc, hereupon two slots 66a and 66b are illustrated in FIG. 5. The operation panel 61 is provided with a plurality of switches 62, 62a and 62b for switching over each function of the component audio system 60 and for controlling a volume level and so on, and also provided with a display 63 mounted with a touch panel.

As mentioned above, the operation panel 61 is installed with the switches 62, 62a and 62b and the display 63 mounted with the touch panel. As shown in FIG. 6, the switch 62 is installed with a sensor section 15a in which a detection electrode Aa and another detection electrode Ba are disposed in a flat configuration.

Further, the switch 62a is installed with a sensor section 15b in which a detection electrode Ab and another detection electrode Bb are disposed in a flat configuration.

Furthermore, the switch 62b is installed with a sensor section 15c in which a detection electrode Ac and another detection electrode Bc are disposed in a flat configuration.

More, the display 63 is installed with a sensor section 15d in which a detection electrode Ad and another detection electrode Bd are disposed in a flat configuration.

Hereinafter, reference signs of the sensor sections 15a-15d, the detection electrodes Aa-Ad and the other detection electrodes Ba-Bd are generically referred to as 15, A and B respectively.

Accordingly, by installing the sensor section 15 of the approach sensing device 50 in the switches 62, 62a and 62b respectively, the approach sensing device 50 functions as operation switches of the component audio system 60 of which switch contacts are never worn out even though the switches 62, 62a and 62b are turned on and off repeatedly, and further the operation switches are excellent in resistant to noise.

When installing the sensor section 15, an insulator of which thickness and material will not extremely affect change of electrostatic capacitance of the sensor section 15 in response to an object such as a human body approaching the sensor section 15, can be mounted together with the sensor section 15 so as to protect the sensor section 15, or the sensor section 15 can be buried in the insulator and then installed.

Further, in the case where a plurality of switches is disposed closely in the operation panel 61 as shown in FIG. 6, it is possible to unify a plurality of detection electrodes Aa-Ad in one detection electrode A and to connect a plurality of approach sensing devices 50 in parallel to each other as shown in FIG. 7, wherein four approach sensing devices 50 are connected in parallel in FIG. 7. In FIG. 7, a circuit configuration of each approach sensing device 50 is the same as the circuit configuration of the approach sensing device 50 shown in FIG. 1.

Furthermore, the detection electrodes A and B in the sensor section 15 can be disposed not only in a parallel disposition like the sensor sections 15a and 15d of the switches 62 and 63 as shown in FIG. 6 but also in a radial pattern such as the sensor sections 15b and 15c of the switches 62a and 62b shown in FIG. 6.

More, the above-mentioned first embodiment of the present invention exemplifies the microcomputer 1 so as to generate the detection source signal Pa and the detection sub-signal Pe. However, it is also acceptable that the detection source signal Pa is generated by a regular oscillation circuit and the detection sub-signal Pe is produced on the basis of the detection source signal Pa generated by the regular oscillation circuit.

Moreover, in the above-mentioned first embodiment of the present invention, the comparator 41 is used for obtaining the comparator output signal Pf from the judging signal Pd. However, it is also acceptable for obtaining the comparator output signal Pf that the judging signal Pd is directly inputted into an analog to digital converter port of the microcomputer 1.

In addition thereto, in the schematic diagram shown in FIG. 1, replacing the PNP-type switching transistor Q1 with an NPN-type transistor can conduct the same functions and operations of the PNP-type switching transistor Q1. In the case of replacing the PNP-type switching transistor Q1 with an NPN-type transistor, the logic of the detection sub-signal Pe shown in FIG. 2(d) is just inverted in polarities of positive and negative. However, operations of the NPN-type transistor are the same as mentioned above.

Second Embodiment

Figure 8:
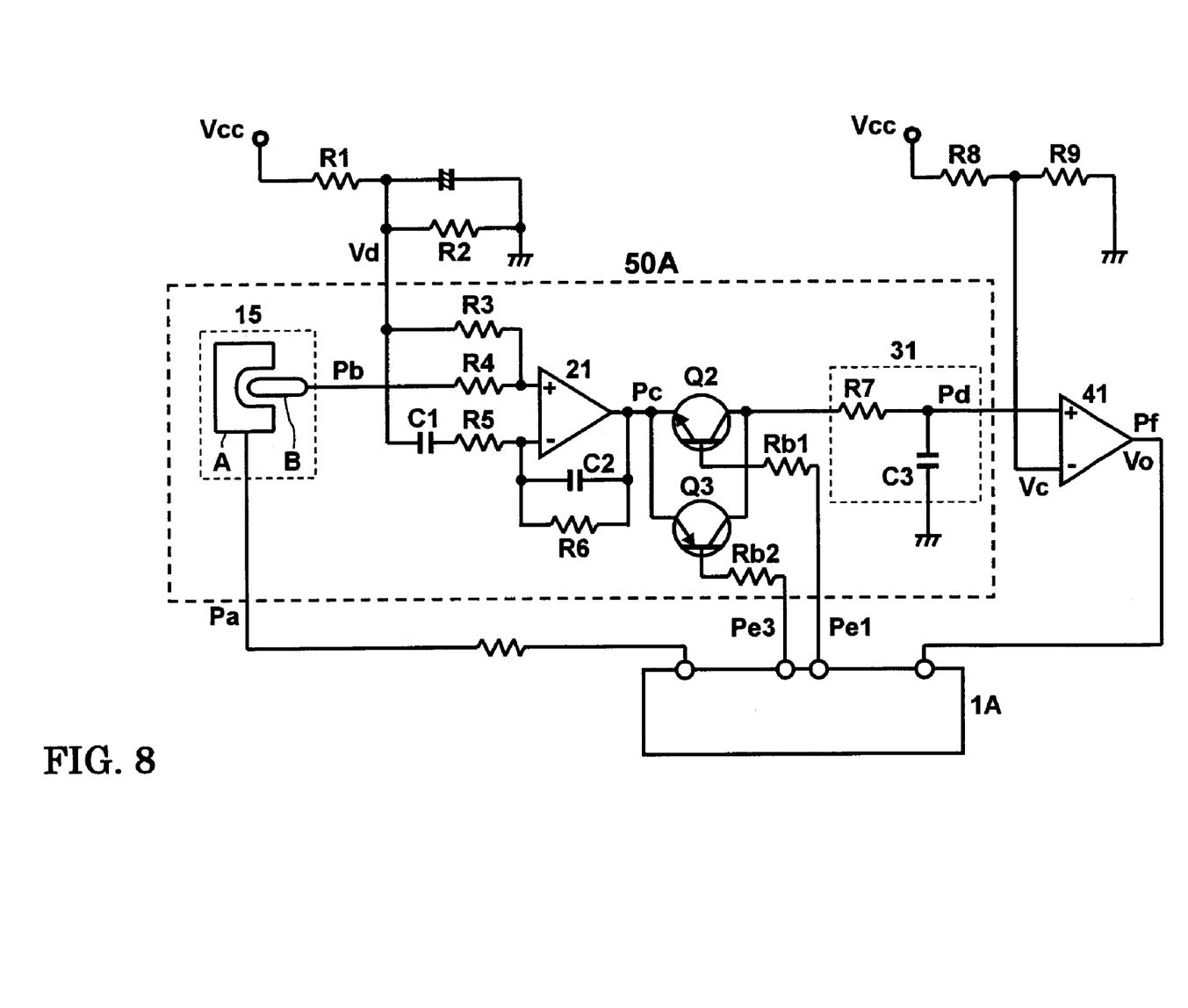
FIG. 8 is a schematic diagram of a sensing device for detecting an approaching object according to a second embodiment of the present invention.

FIG. 8 is a schematic diagram of a sensing device for detecting an approaching object according to a second embodiment of the present invention.

FIGS. 9(a)-9(f) are timing charts among signals at each stage of the sensing device shown in FIG. 8 exhibiting operations of the sensing device.

As shown in FIG. 8, a sensing device for detecting an approaching object (hereinafter referred to as approach sensing device) 50A according to a second embodiment of the present invention is identical to the approach sensing device 50 according to the first embodiment of the present invention except for the detection sub-signal switch or the switching transistor Q1. Consequently, the same components as the approach sensing device 50 are denoted by the same reference signs, and details of their functions and operations are omitted.

In the schematic diagram shown in FIG. 8, a switching section of a detection sub-signal switch of the approach sensing device 50A is constituted by a pair of transistors in different polarities such as an NPN-type switching transistor Q2 and a PNP-type switching transistor Q3 instead of the PNP-type switching transistor Q1. The emitter and collector terminals of the PNP-type switching transistor Q3 are connected to those of the NPN-type switching transistor Q2 respectively.

Further, a detection sub-signal Pe1 is supplied from a microcomputer 1A to the base of the NPN-type switching transistor Q2 through a base resistor Rb1. Hereupon, a frequency of the detection sub-signal Pe1 is equal to that of the detection source signal Pa, and the detection sub-signal Pe1 maintains specific phase relation with the detection source signal Pa, and further a duty ratio of the detection sub-signal Pe1 is less than 50%.

Furthermore, another detection sub-signal Pe3 is supplied from the microcomputer 1A to the base of the PNP-type switching transistor Q3 through a base resistor Rb2. Hereupon, a frequency of the detection sub-signal Pe3 is equal to that of the detection source signal Pa, and the other detection sub-signal Pe3 maintains specific phase relation with the detection source signal Pa, and further a duty ratio of the other detection sub-signal Pe3 is more than 50%.

Figure 9:
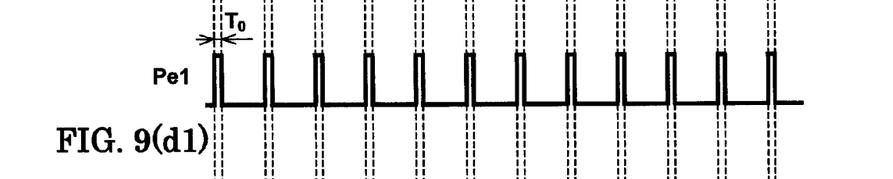
FIGS. 9(a)-9(f) are timing charts among signals at each stage of the sensing device shown in FIG. 8 exhibiting operations of the sensing device.
Figure 9A:
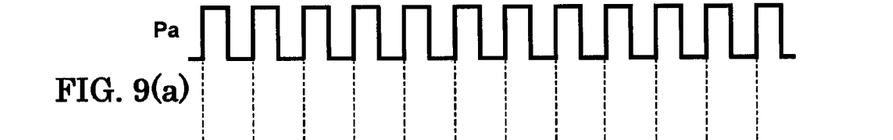
Figure 9B:
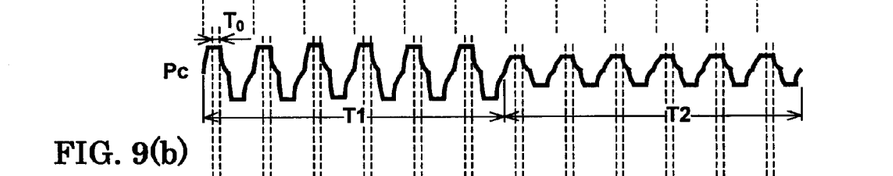
Figure 9C:
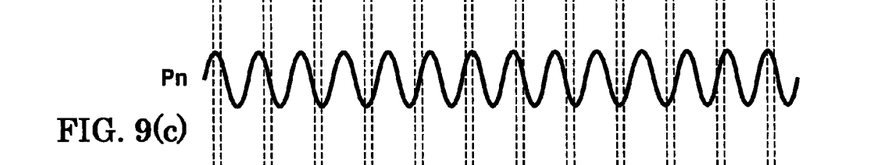
Figure 9E:
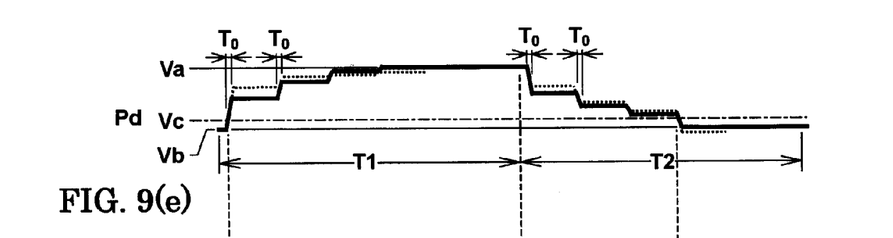
Figure 9F:
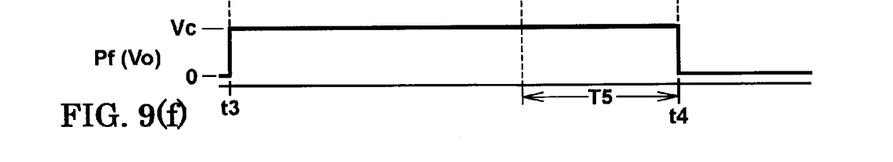

More, as shown in FIGS. 9(d1) and 9(d2), the other detection sub-signal Pe3 is inverted in polarity with respect to the detection sub-signal Pe1.

In addition thereto, timing charts shown in FIGS. 9(a)-9(f) are identical to those shown in FIGS. 2(a)-2(f) except for the detection sub signal Pe1 shown in FIG. 9(d1) and the other detection sub-signal Pe3 shown in FIG. 9(d2). Polarities of the detection sub-signals Pe1 and Pe3 are defined so as to comply with switching operations of the NPN-type and PNP-type switching transistors Q2 and Q3 respectively. In this regard, operations and functions of respective signals shown in FIGS. 9(a)-9(f) are the same as those shown in FIGS. 2(a)-2(f).

Accordingly, detailed descriptions of the signals shown in FIGS. 9(a)-9(f) are omitted.

Third Embodiment

Figure 10:
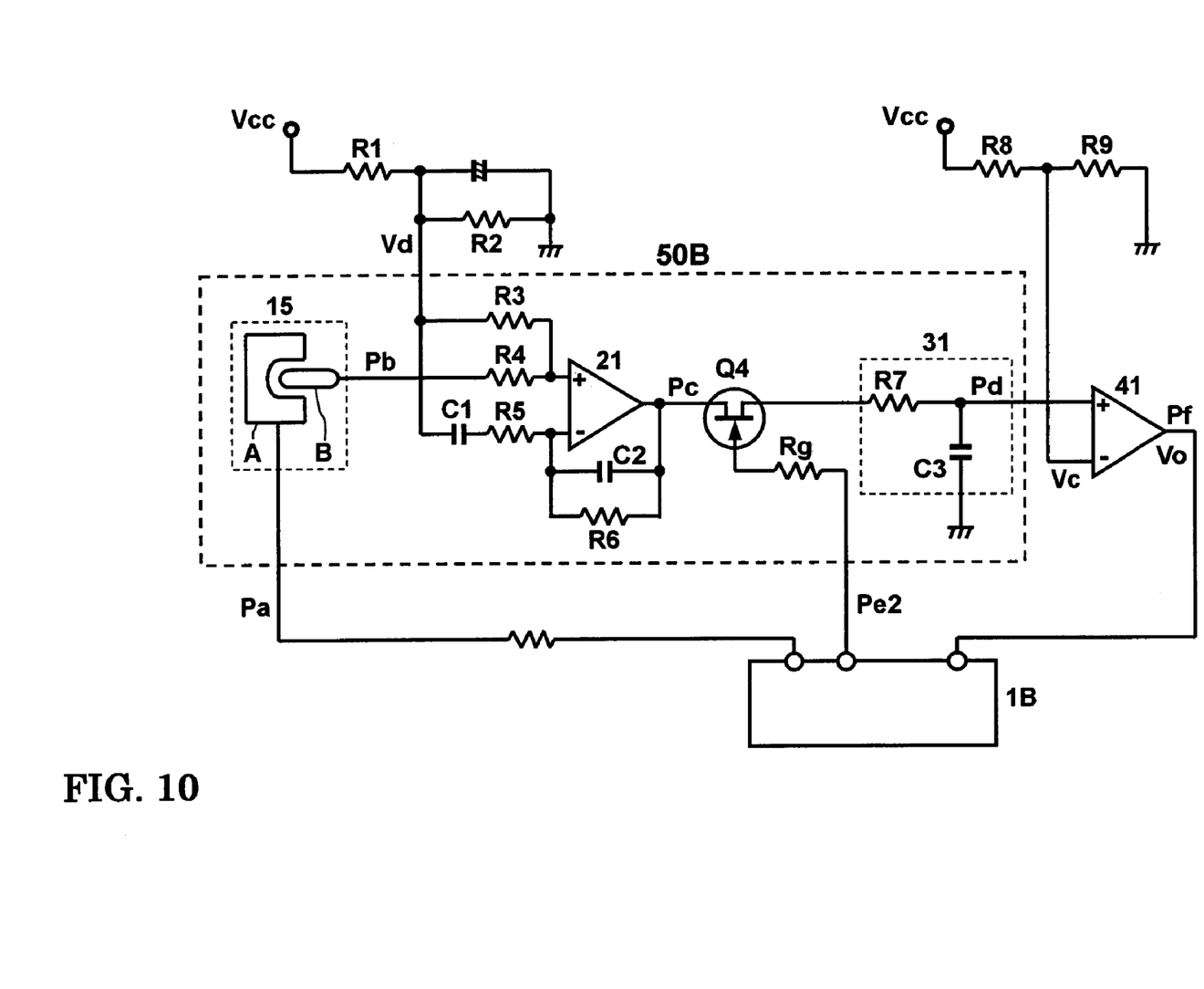
FIG. 10 is a schematic diagram of a sensing device for detecting an approaching object according to a third embodiment of the present invention.

FIG. 10 is a schematic diagram of a sensing device for detecting an approaching object according to a third embodiment of the present invention.

FIGS. 11(a)-11(f) are timing charts among signals at each stage of the sensing device shown in FIG. 10 exhibiting operations of the sensing device.

As shown in FIG. 10, a sensing device for detecting an approaching object (hereinafter referred to as approach sensing device) 50B according to a third embodiment of the present invention is identical to the approach sensing device 50 according to the first embodiment of the present invention except for the detection sub-signal switch or the switching transistor Q1. Consequently, the same components as the approach sensing device 50 are denoted by the same reference signs, and details of their functions and operations are omitted.

In FIG. 10, a switching section of a detection sub-signal switch of the approach sensing device 50B according to the third embodiment of the present invention is constituted by an N-channel junction type field-effect transistor (FET) Q4 instead of the PNP-type switching transistor Q1. The gate terminal of the FET Q4 is inputted with a detection sub-signal Pe2 outputted from a microcomputer 1B through a gate resistor Rg. Hereupon, a frequency of the detection sub-signal Pe2 is equal to that of the detection source signal Pa, and the detection sub-signal Pe2 maintains specific phase relation with the detection source signal Pa, and further a duty ratio of the detection sub-signal Pe2 is less than 50%.

Figure 11A:
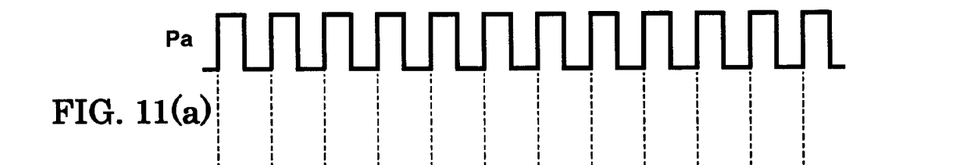
FIGS. 11(a)-11(f) are timing charts among signals at each stage of the sensing device shown in FIG. 10 exhibiting operations of the sensing device.
Figure 11B:
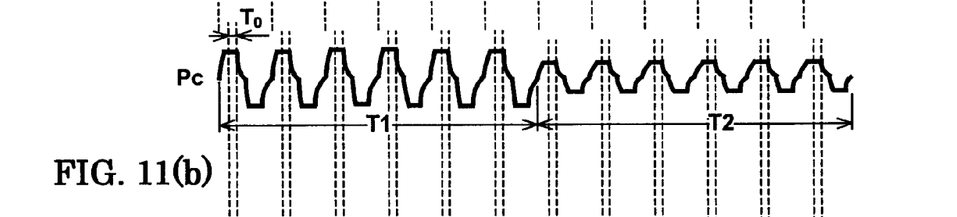
Figure 11C:
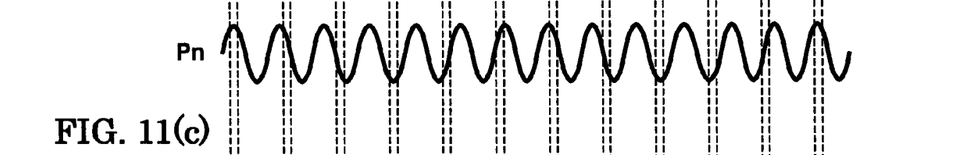
Figure 11D:
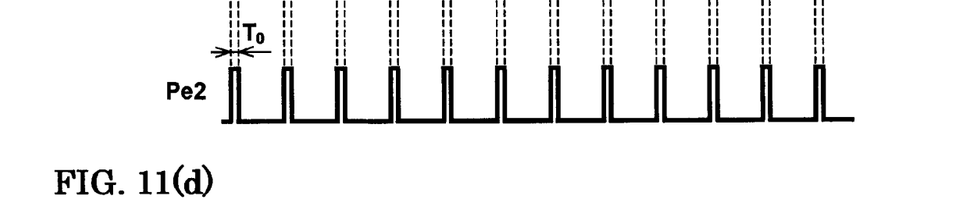
Figure 11E:
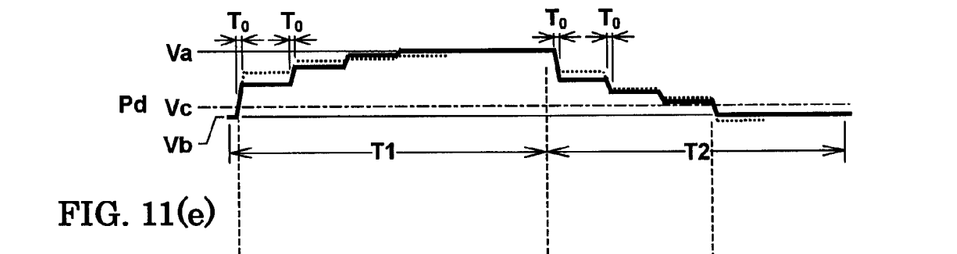
Figure 11F:
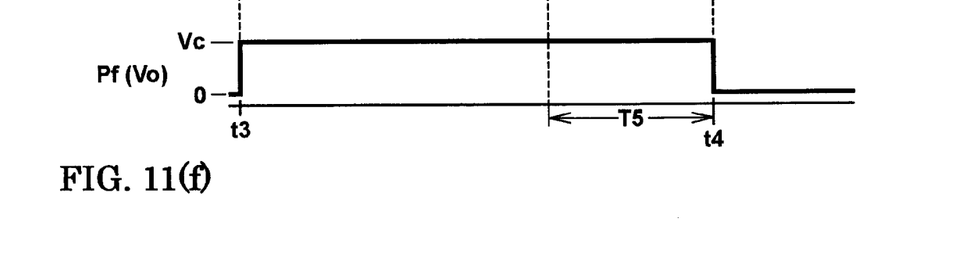

Further, timing charts shown in FIGS. 11(a)-11(f) are identical to those shown in FIGS. 2(a)-2(f) except for the detection sub-signal Pe2 shown in FIG. 11(d). A polarity of the detection sub-signal Pe2 is inverted in comparison with that of the detection sub-signal Pe shown in FIG. 1, so as to comply with switching operation of the N-channel FET Q4. In this regard, operations and functions of respective signals shown in FIGS. 11(a)-11(f) are the same as those shown in FIGS. 2(a)-2(f).

Accordingly, detailed descriptions of the signals shown in FIGS. 11(a)-11(f) are omitted.

As mentioned above, the approach sensing device according to the present invention can eliminate an interfering signal, of which frequency is close to that of the detection source signal, without adopting a narrow-band band pass filter. Consequently, designing for circuitry is made easier, and it is not necessary for the frequency of the detection source signal and a pass frequency band of the band pass filter to be controlled or adjusted.

Further, a narrow-band band pass filter is not essential, so that a number of component parts can be saved, and then it is possible to realize the approach sensing device that is reduced in circuit scale and excellent in cost saving and space saving.

In addition thereto, a narrow-band band pass filter is not essential, so that a circuit configuration is made simple.

Accordingly, the approach sensing device according to the present invention can be improved in operational stability.

While the invention has been described above with reference to a specific embodiment thereof, it is apparent that many changes, modifications and variations in configuration, materials and the arrangement of equipment and devices can be made without departing form the invention concept disclosed herein.

In addition thereto, it will be apparent to those skilled in the art that various modifications and variations could be made in the motor and the disc drive apparatus field in the present invention without departing from the scope of the invention.

What is claimed is:

1. A sensing device for detecting an approaching object comprising:
   (a) a sensor section, the sensor section including
   (1) a first detection electrode supplied with a detection source signal having a prescribed frequency, and
   (2) a second detection electrode disposed in close vicinity to the first detection electrode,
   wherein a communication signal is obtained from the detection source signal that is transmitted to the second detection electrode from the first detection electrode and attenuated thereat when an object approaches the sensor section;
   (b) a communication signal amplifier amplifying the communication signal and outputting the amplified communication signal as an amplifier output signal;
   (c) an integrator integrating the amplifier output signal and outputting a judging signal for judging whether or not an object approaches the sensor section; and
   (d) a detection sub-signal switch disposed between an output side of the communication signal amplifier and an input side of the integrator;
   wherein the detection sub-signal switch periodically switches on only during a prescribed period in which a peak value of the amplifier output signal is included in response to a detection sub-signal,
   wherein a frequency of the detection sub-signal is equal to that of the detection source signal, and
   wherein the detection sub-signal maintains specific phase relation with the detection source signal, further
   wherein a duty ratio of the detection sub-signal is less than 50%.

2. The sensing device as claimed in claim 1, wherein the detection sub-signal switch is constituted by a transistor.

3. The sensing device as claimed in claim 1, wherein the detection sub-signal switch is constituted by a pair of transistors in different polarities.

4. The sensing device as claimed in claim 1, wherein the detection sub-signal switch is constituted by a field-effect transistor.

* * * * *